(12) United States Patent
Liu

(10) Patent No.: US 11,879,690 B2
(45) Date of Patent: Jan. 23, 2024

(54) FLEXIBLE WICK STRUCTURE AND DEFORMABLE HEAT-DISSIPATING UNIT USING THE SAME

(71) Applicant: ASIA VITAL COMPONENTS (CHINA) CO., LTD., Shenzhen (CN)

(72) Inventor: Han-Min Liu, Shenzhen (CN)

(73) Assignee: Asia Vital Components (China) Co., Ltd., Shenzhen (CN)

( * ) Notice: Subject to any disclaimer, the term of this patent is extended or adjusted under 35 U.S.C. 154(b) by 0 days.

(21) Appl. No.: 16/867,570

(22) Filed: May 6, 2020

(65) Prior Publication Data
US 2021/0348852 A1    Nov. 11, 2021

(51) Int. Cl.
*F28D 15/04* (2006.01)
*F28D 15/02* (2006.01)
*H05K 7/20* (2006.01)

(52) U.S. Cl.
CPC ....... *F28D 15/046* (2013.01); *F28D 15/0233* (2013.01); *H05K 7/20336* (2013.01)

(58) Field of Classification Search
CPC . F28D 15/046; F28D 15/0241; H01L 23/427; F28F 15/02; F28F 15/04; F28F 2255/02; H05K 7/20336
See application file for complete search history.

(56) References Cited

U.S. PATENT DOCUMENTS

| | | | |
|---|---|---|---|
| 4,951,740 A * | 8/1990 | Peterson | F28D 15/046 165/104.26 |
| 7,647,961 B2 * | 1/2010 | Thayer | F28D 15/0241 165/104.26 |
| 2004/0052052 A1 * | 3/2004 | Rivera | H01L 23/4332 361/700 |
| 2010/0078151 A1 | 4/2010 | Koenigsberg et al. | |
| 2012/0170221 A1 * | 7/2012 | Mok | H01L 23/4332 361/700 |

(Continued)

FOREIGN PATENT DOCUMENTS

| | | |
|---|---|---|
| CN | 2421606 Y | 2/2001 |
| CN | 101995182 A | 3/2011 |

(Continued)

OTHER PUBLICATIONS

Search Report dated Oct. 23, 2020 issued by Taiwan Intellectual Property Office for counterpart application No. 109112820.

*Primary Examiner* — Tavia Sullens
*Assistant Examiner* — Khaled Ahmed Ali Al Samiri
(74) *Attorney, Agent, or Firm* — Jackson IPG PLLC; Demian K. Jackson

(57) ABSTRACT

The present invention provides a flexible wick structure and a deformable heat-dissipating unit using the same. The heat-dissipating unit comprises a heat-dissipating body and a flexible wick structure. The heat-dissipating body has an upper plate, a chamber, and a lower plate. The flexible wick structure is disposed in the chamber and has a wick body and plural extension portions being able to be elastically deformed under compression; the extension portions extend outwards from a side of the wick body to carry the wick body. In addition, the extension portions and the wick body together define an axial-displacement space; the wick body or the extension portions are in contact with an inner side of the upper plate or the low plate.

7 Claims, 10 Drawing Sheets

(56) References Cited

U.S. PATENT DOCUMENTS

2012/0325438 A1   12/2012   Meyer, IV et al.
2015/0198379 A1   7/2015   Pai

FOREIGN PATENT DOCUMENTS

| CN | 104792201 A | 7/2015 | |
|----|----|----|----|
| JP | 2009-236362 A | 10/2009 | |
| TW | 200918843 A | 5/2009 | |
| TW | M366059 | 10/2009 | |
| TW | 200950629 A | 12/2009 | |
| TW | M376120 U | 3/2010 | |
| TW | M378614 U | 4/2010 | |
| TW | 201033567 A1 | 9/2010 | |
| TW | 201041496 A | 11/2010 | |
| TW | 201102604 A | 1/2011 | |
| TW | 201544783 A | 12/2015 | |
| TW | M598967 | 7/2020 | |
| WO | WO-2020191473 A1 * | 10/2020 | ......... H01L 23/4332 |

* cited by examiner

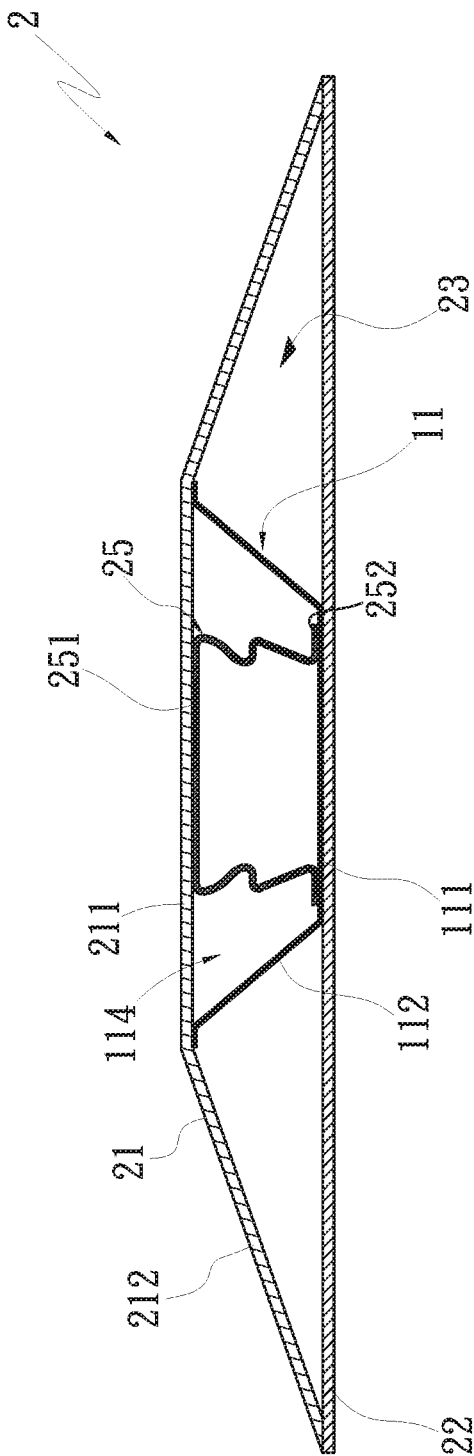
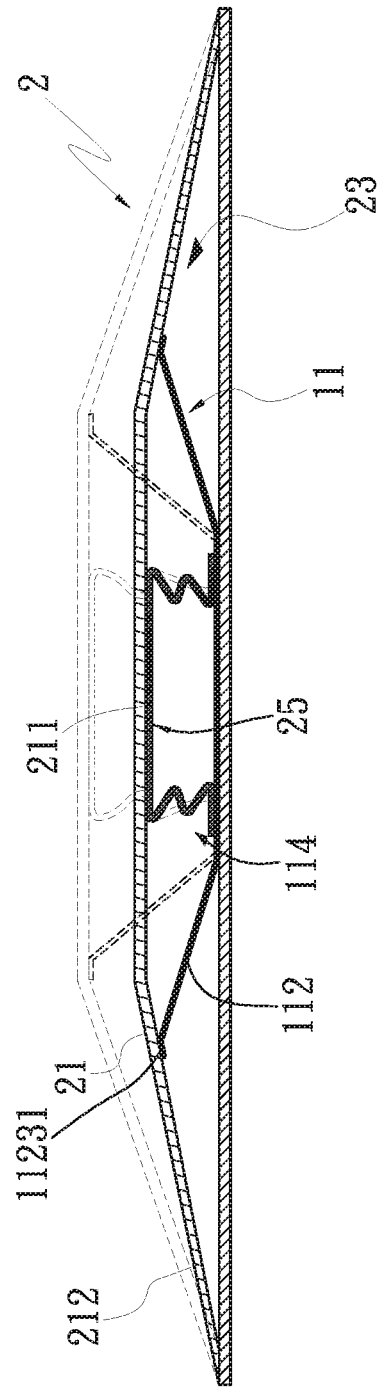

FLEXIBLE WICK STRUCTURE AND DEFORMABLE HEAT-DISSIPATING UNIT USING THE SAME

BACKGROUND OF THE INVENTION

1. Field of the Invention

The present invention relates to a flexible wick structure and a deformable heat-dissipating unit using the same and in particular to a flexible wick structure and a deformable heat-dissipating unit using the same, which can be deformed under compression.

2. Description of Prior Art

The current vapor chamber is a vacuum chamber formed by directly welding an upper plate and a lower plate. The wick structure (e.g., the sintered powder, the mesh, the fiber, or the groove) and the working fluid are disposed on the inner wall of the chamber such that the vapor chamber can rapidly conduct the heat generated from a heat source to a large area for cooling. In this way, the vapor chamber becomes an apparatus which can provide high performance in heat dissipation.

However, the whole structure of the current vapor chamber is stiff and cannot be changed according to requirements. For example, the height of the interior of the chamber of the vapor chamber is fixed and thus an axial displacement of the vapor chamber is not allowed. Also, the wick structure is directly formed and fixed on the inner wall of the chamber horizontally, which cannot produce the deformation with an axial displacement. When the vapor chamber is stuck to a heat-generating device (e.g., a CPU or a GPU) on a circuit board (e.g., a mother board) inside an electronic apparatus (e.g., a desktop computer, a notebook computer, a 3C product, or a communication apparatus), the installation space to attach the vapor chamber to the heat-generating device is confined because other electronic components including passive electronic components are disposed around the heat-generating device on the circuit board. Moreover, there are specific height differences between the heat-generating device and the surrounding electronic devices. Consequently, the overall size of the vapor chamber is usually larger than the installation space for the heat-generating device and cannot be assembled together. Or, the vapor chamber is obstructed by the surrounding electronic devices and cannot be assembled. As a result, the current vapor chamber cannot provide an adjustable height to meet various requirements.

SUMMARY OF THE INVENTION

One objective of the present invention is to provide a flexible wick structure which can be deformed under compression.

Another objective of the present invention is to provide a flexible wick structure with improved structural flexibility.

Yet another objective of the present invention is to provide a deformable heat-dissipating unit when undergoing compression.

Still another objective of the present invention is to provide a deformable heat-dissipating unit with improved structural flexibility.

To achieve the above objectives, the present invention provides a flexible wick structure applied to a heat-dissipating unit. The flexible wick structure comprises a wick body and a plurality of extension portions being able to be elastically deformed under compression. The extension portions extend outwards from a side of the wick body to carry the wick body. The extension portions and the wick body together define an axial-displacement space.

The present invention also provides a deformable heat-dissipating unit which comprises a heat-dissipating body and a flexible wick structure. The heat-dissipating body has an upper plate, a chamber, a lower plate covered with the upper plate. A working fluid is filled in the chamber. The flexible wick structure is disposed in the chamber. The flexible wick structure has a wick body and a plurality of extension portions being able to be elastically deformed under compression. The extension portions extend outwards from a side of the wick body to carry the wick body. The extension portions and the wick body together define an axial-displacement space. The wick body or the extension portions are in contact with an inner side of the upper plate or the low plate.

By means of the design of the present invention, the deformability under compression and the capillary attraction can be achieved. In addition, the improved structural flexibility can be effectively obtained.

BRIEF DESCRIPTION OF DRAWING

FIG. 6B is a schematic view of the heat-dissipating unit according to a variant of the second embodiment of the present invention in an original state (without compression and deformation);

FIG. 6C is a schematic view of the heat-dissipating unit according to a variant of the second embodiment of the present invention in a compressed and deformed state;

DETAILED DESCRIPTION OF THE INVENTION

The above objectives of the present invention and the features of structure and function of the present invention are described according to preferred embodiments in accompanying figures.

Figure 1A:
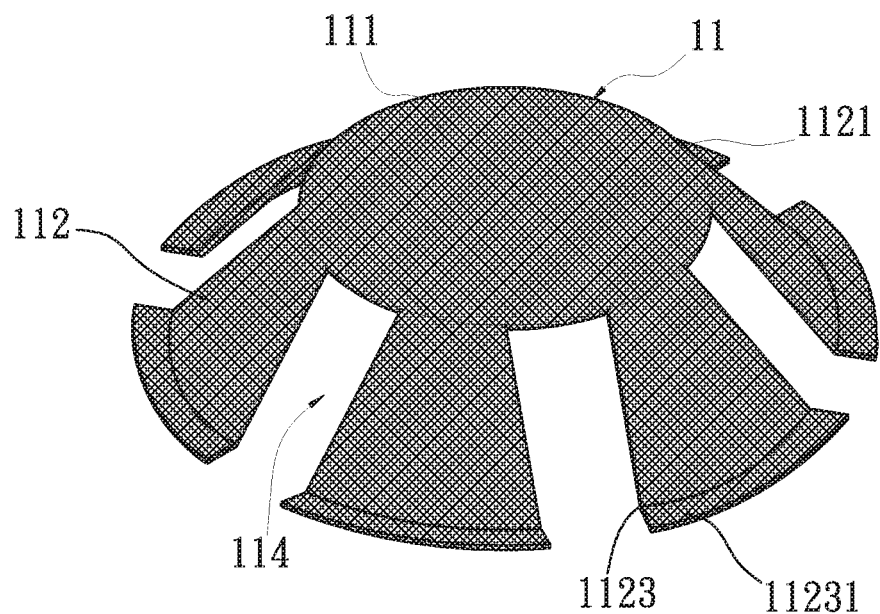
FIG. 1A is a perspective view of the flexible wick structure according to the first embodiment of the present invention.
Figure 1B:
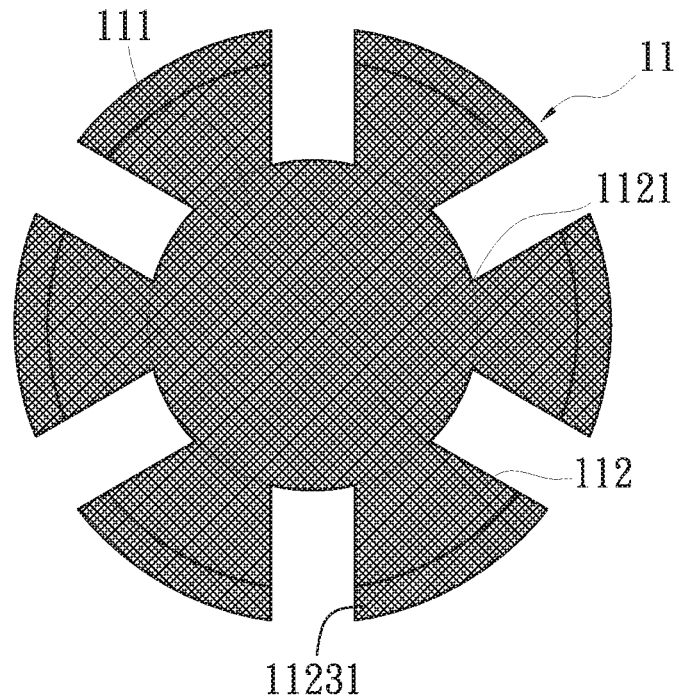
FIG. 1B is a top view of the flexible wick structure in FIG. 1A.

The present invention provides a flexible wick structure. Please refer to FIG. 1A which is a perspective view of the flexible wick structure according to the first embodiment of the present invention and FIG. 1B which is a top view of the flexible wick structure in FIG. 1A. The flexible wick structure 11 is applied to a heat-dissipating unit (not shown) like a vapor chamber or a heat conductive plate. The flexible wick structure 11 can be the sintered powder, the mesh, the woven body, or the fiber which is made of metal, non-metal, or plastic material. In the current embodiment, the woven body is taken as an example for explanation. The woven body is a porous liquid-absorbing structure woven from a plurality of metal filaments. The metal filaments are made of copper, stainless steel, aluminum, nickel, titanium, alloy, or a combination thereof. Alternatively, the woven body can be a porous structure made of plastic. In the current embodiment, the flexible wick structure 11 has a shape of a flower, a daisy-like shape viewed from FIG. 1B, but not limited to this. In practice, the flexible wick structure 11 can have a shape of a claw, an arch, or others. The flexible wick structure 11 comprises a wick body 111 and a plurality of extension portions 112 which can be elastically deformed under compression. In the current embodiment, the wick body 111 and the extension portions 112 are like a round disk as the simulated disk florets and the ray florets as the simulated petals, respectively. The wick body 111 and the extension portions 112 are integrally formed. In other embodiments, the wick body 111 and the extension portions 112 can be separate parts and then be combined as one port by the connection method such as adhesion, welding, or embedment to form the above-mentioned flexible wick structure 11. Besides, because the wick body 111 and the extension portions 112 are not integrally formed, their materials (e.g., metal, non-metal, or plastic) and types of wicks (e.g., the sintered powder, mesh, woven body, or fiber) can be any combination of the same or different materials and types of wicks.

In another embodiment, each of the wick body 111 and the extension portions 112 has a polygonal shape (e.g., a triangle, a pentagon, a rectangle, or irregular shape).

The extension portions 112 extend outwards and downwards from a side of the wick body 111. That is, the extension portions 112 are disposed circularly on a bottom side of the wick body 111 with equal or unequal spaces to carry the wick body 111. Each of the extension portions 112 has a fixed end 1121 and a free end 1123; the fixed end 1121 of each of the extension portions 112 is connected to the bottom side of the wick body 111 and the free end 1123 extends outwards and horizontally to form a foot portion 11231. The foot portion 11231 preforms the functions of increasing contact area (and then the capillary attraction) and improving structural stability. Furthermore, the extension portions 112 and the wick body 111 together define an axial-displacement space (i.e., the height) 114. The axial-displacement space 114 allows the wick body 111 and the joint of the extension portions 112 and the wick body 111 to produce an axial displacement in the axial-displacement space 114. For example, an upward, downward, or back-and-forth movement.

Therefore, when the top side of the wick body 111 of the flexible wick structure 11 is exerted by an axial force (e.g., a downward force) and the wick body 111 moves downwards in the axial-displacement space 114 under the downward force (e.g., an impact force or a compact force with a heat-dissipating device), the extension portions 112 simultaneously undergo the axial force from the wick body 111 such that the free ends 1123 of the extension portions 112 are compressed and elastically deformed to move outwards (i.e., move away from the axial-displacement space 114). At this moment, the flexible wick structure 11 is in a compressed and deformed state. When the axial force exerted on the top side of the wick body 111 is removed, the extension portions 112 will move inwards the axial-displacement space 114 via their own elastic recovery force. Meanwhile, the extension portions 112 bring the wick body 111 thereon to move upwards and towards the axial-displacement space 114 such that the flexible wick structure 11 is recovered to its original state (i.e., without compression and deformation). Thus, by means of the flexible wick structure of the present invention which can be deformed under compression, whether it is deformed or not, the condensed working fluid in the condenser (not shown) of the heat-dissipating unit can rapidly flow back to the evaporator (not shown) of the heat-dissipating unit through the wick body 111 of the flexible wick structure 11 and the capillary attraction of the extension portions 112.

Hence, by means of the design of the flexible wick structure 11 of the present invention, the deformability under compression and the capillary attraction can be achieved. In addition, the improved structural flexibility can be effectively obtained Please refer to FIG. 2 which is an exploded view of the heat-dissipating unit according to the second embodiment of the present invention, FIG. 3 which is an assembled view of the deformable heat-dissipating unit according to the second embodiment of the present invention, FIG. 4A which is a schematic view of the heat-dissipating unit according to the second embodiment of the present invention in an original state (without compression and deformation), FIG. 4B which is a schematic view of the heat-dissipating unit according to the second embodiment of the present invention in a compressed and deformed state, FIG. 4C which is an assembled cross-sectional view of the heat-dissipating unit according to a variant of the second embodiment of the present invention, FIG. 5A which is an assembled cross-sectional view of the heat-dissipating unit according to another variant of the second embodiment of the present invention, FIG. 5B which is an exploded view of the heat-dissipating unit in FIG. 5A, FIG. 6A which is an exploded view of the heat-dissipating unit according to a variant of the second embodiment of the present invention, FIG. 6B which is a schematic view of the heat-dissipating unit according to a variant of the second embodiment of the present invention in an original state (without compression and deformation), and FIG. 6C which is a schematic view of the heat-dissipating unit according to a variant of the second embodiment of the present invention in a compressed and deformed state. As shown in FIGS. 2, 3, 4A, and 4B, together with FIGS. 1A and 1B, the flexible wick structure 11 described in the previous embodiments is disposed in the heat-dissipating unit 2 in the current embodiment. The heat-dissipating unit 2 in the current embodiment can be a vapor chamber which is deformable under compression, but not limited to this. In practice, the heat-dissipating unit 2 can be a heat conductive plate which is deformable under compression. The heat-dissipating unit 2 comprises a heat-dissipating body 20 and a flexible wick structure 11. The structure and functions of the flexible wick structure 11 in the current embodiment are identical to those in the first embodiment and will not be described again hereafter.

The heat-dissipating body 20 has an upper plate 21, a chamber 23, a lower plate 22 covered with the upper plate 21, an evaporator 201, and a condenser 202. The upper plate 21 and the lower plate 22 are made of metal or ceramic. The metal can be gold, silver, copper, iron, aluminum, stainless steel, titanium, or alloy. The evaporator 201 and the condenser 202 of the heat-dissipating body 20 are disposed on the lower plate 22 and the upper plate 21, respectively. The evaporator 201 (i.e., the lower plate 22) is stuck to a heat-generating device such as a CPU, a GPU, a Northbridge, a Southbridge, or other heat sources (not shown). The heat-generating device is stuck to the outside of the evaporator 201 of the wick body 111 of the flexible wick structure 11. The upper plate 21 is provided with a base 211 and a side portion 212 which can be elastically deformed under compression; the side portion 212 extends outwards from the edge of the base 211 and can be axially compressed or elastically recovered. In the current embodiment, the side portion 212 extends outwards from the outer edge of the base 211 and slopes downward. The bottom side of the side portion 212 and an inner side of the lower plate 22 are attached to each other and tightly sealed such that the chamber 23 of the heat-dissipating body 20 is in a vacuum state.

A working fluid (e.g., pure water, methanol, or refrigerant) is filled in the chamber 23. In the current embodiment, there is no wick structure (e.g., the sintered powder or the woven body) disposed on the inner walls of the chamber 23 of the condenser 202 and the evaporator 201 (i.e., the inner sides of the upper plate 21 and the lower plate 22). The flexible wick structure 11 is disposed in the chamber 23; the wick body 111 of the flexible wick structure 11 or the extension portions 112 are in contact with the inner side of the upper plate 21 or the low plate 22. In the current embodiment, the top side of the wick body 111 is directly in contact with the inner side of the lower plate 22; the free ends 1123 and the foot portions 11231 of the extension portions 112 are directly in contact with the inner side of the base 211 of the upper plate 21. Through the foot portions 11231 with large contact area in contact with the inner side of the upper plate 21, the contact area in between can be increased; thus, the capillary attraction is increased and the contact stability is enhanced. By means of the wick body 111 of the flexible wick structure 11 used as the wick structure in the evaporator 201 of the heat-dissipating body 20, the working liquid on the wick body 111 of the evaporator 201 absorbs the heat from the heat-generating device and is then transformed into the evaporated working liquid (or the working liquid in a vapor state). The condensed working liquid (or the working liquid in a liquid state) on the condenser 202 can rapid flow downwards to the wick body 111 in the evaporator 201 through the extension portions 112 and the capillary attraction of the foot portions 11231 thereof. Besides, some of the working liquid in the condenser 202 can drip by gravity and return to the evaporator 201. Therefore, with the multiple return paths through which the condensed working liquid can rapidly flow back, the situation of dry-heating in the evaporator 201 can be prevented and the heat-dissipating cycle can be improved. Moreover, the design of no wick structure disposed on the inner sides of the upper plate 21 and the lower plate 22 in the present invention can effectively increase the space for vapor in the chamber to effectively improve the circulation of liquid and vapor. In one embodiment, the top side of the wick body 111 of the flexible wick structure 11 is directly in contact with the inner side of the lower plate 22; the free ends 1123 of the extension portions 112 are directly connected to the inner side of the lower plate 22.

Figure 4A:
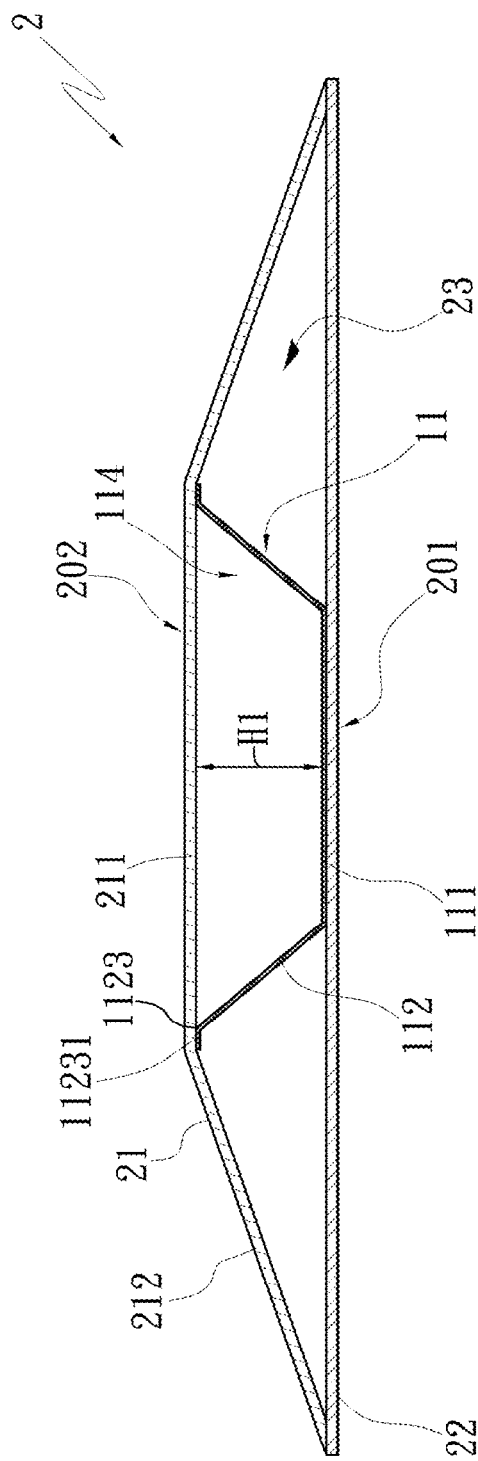
FIG. 4A is a schematic view of the heat-dissipating unit according to the second embodiment of the present invention in an original state (without compression and deformation)
Figure 4B:
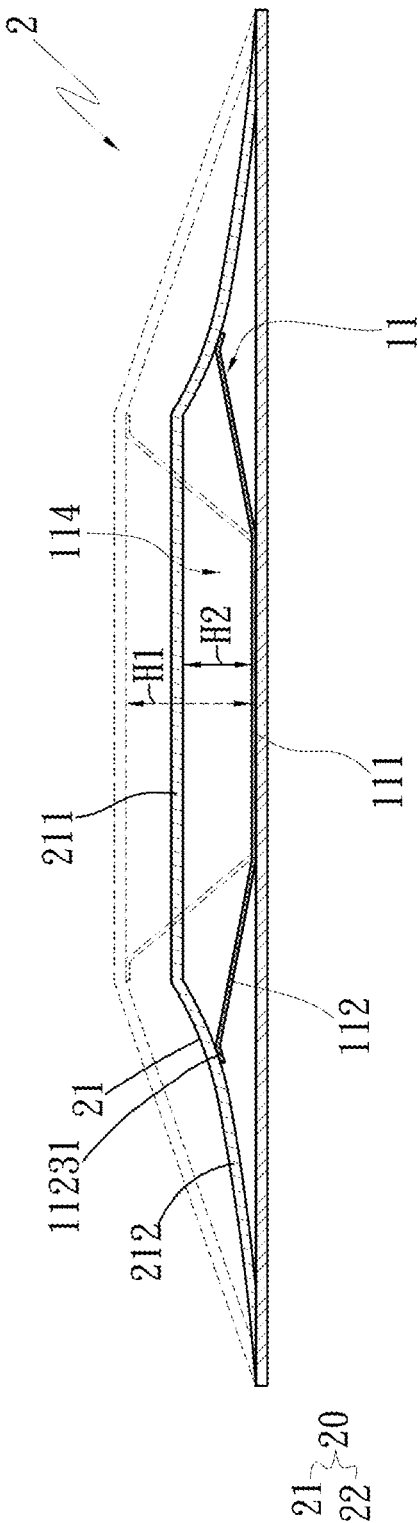
FIG. 4B is a schematic view of the heat-dissipating unit according to the second embodiment of the present invention in a compressed and deformed state.
Figure 4C:
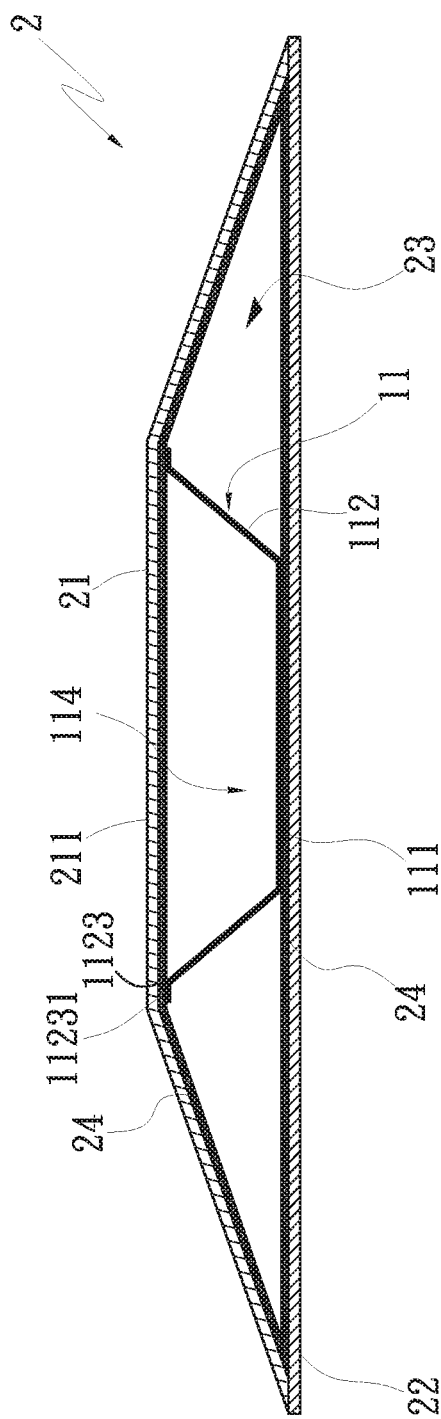
FIG. 4C is an assembled cross-sectional view of the heat-dissipating unit according to a variant of the second embodiment of the present invention.

When the outer surface of the base 211 of the upper plate 21 of the heat-dissipating body 20 is exerted by an axial force (e.g., a downward force) and the base 211 of the upper plate 21 moves under the downward force towards the lower plate 22 in the chamber 23 (e.g., an impact force or a compact force with a heat-dissipating device), the side portion 212 with flexibility also undergoes the downward force from the base 211 such that the side portion 212 is compressed to be elastically deformed and move downwards with base 211 in the chamber 23. Meanwhile, the free ends 1123 of the extension portions 112 in the chamber 23 also undergo the downward force from the base 211 such that the foot portions 11231 and the free ends 1123 of the extension portions 112 are compressed to be elastically deformed and move towards the side portion 212 from the inside of the base 211. Also, the foot portions 11231 and the free ends 1123 of the extension portions 112 are in contact with the inner side of the base 211. At this time, the heat-dissipating body 20 descends from the first height H1 to the second height H2 in the axial-displacement space 114 to be in a compressed and deformed state as shown in FIG. 4B. When the axial force exerted on the base 211 of the upper plate 21 is removed, the heat-dissipating body 20 is recovered to its original state (i.e., the upper plate 21 of the heat-dissipating body 20 is not compressed and deformed as shown in FIG. 4A) by means of the elastic recovery force of the side portion 212. Besides, the flexible wick structure 11 of the chamber 23 is recovered to a state without compression and deformation through the extension portions 112 as shown in FIG. 4A. That is, the heat-dissipating body 20 is recovered from the second height H2 to the first height H1 in the axial-displacement space 114.

In an alternative embodiment, a horizontally-extending wick structure (not shown) is disposed at the edge of the wick body 111 of the flexible wick structure 11. The horizontally-extending wick structure extends horizontally from the edge of the flexible wick structure 11 adjacent to the fixed ends 1121 to the inner side of the evaporator 201 (i.e., the inner side of the lower plate 22). By means of the wick body 111 and the horizontally-extending wick structure occupying the inner side of the whole evaporator 201 of the chamber 23, the condensed working liquid can rapidly flow back to the evaporator 201 via the capillary attraction of the horizontally-extending wick structure.

In another alternative embodiment, a wick structure 24 is disposed in the chamber 23 and the wick structure 24 is the sintered metal powder, the mesh, the fiber, the groove, or any combination thereof. The wick structure 24 is disposed on the inner side of the upper plate 21 of the chamber 23, on the inner side of the lower plate 22 of the chamber 23, or on the inner sides of the upper plate 21 and the lower plate 22 (i.e., on the inner side of the whole chamber 23). The wick structure 24 is in contact with and connected to the extension portions 112 or the wick body 111. For example, the wick structure 24 is disposed on the inner side of the upper plate 21 of the chamber 23 and the free ends 1123 of the extension portions 112 and the foot portions 11231 thereon are in contact with and connected to the wick structure 24 on the upper plate 21. Alternatively, the wick structure 24 is disposed on the inner sides of the upper plate 21 and the lower plate 22 of the chamber 23 (refer to FIG. 4C). The top side of the wick body 111 is directly in contact with the wick structure 24 on the lower plate 22; the free ends 1123 of the extension portions 112 and the foot portions 11231 thereon are directly in contact with and connected to the wick structure 24 on the upper plate 21 such that the condensed working liquid can rapidly flow back. Thus, the situation of dry-heating in the evaporator 201 can be prevented and the heat-dissipating cycle can be improved.

Figure 5A:
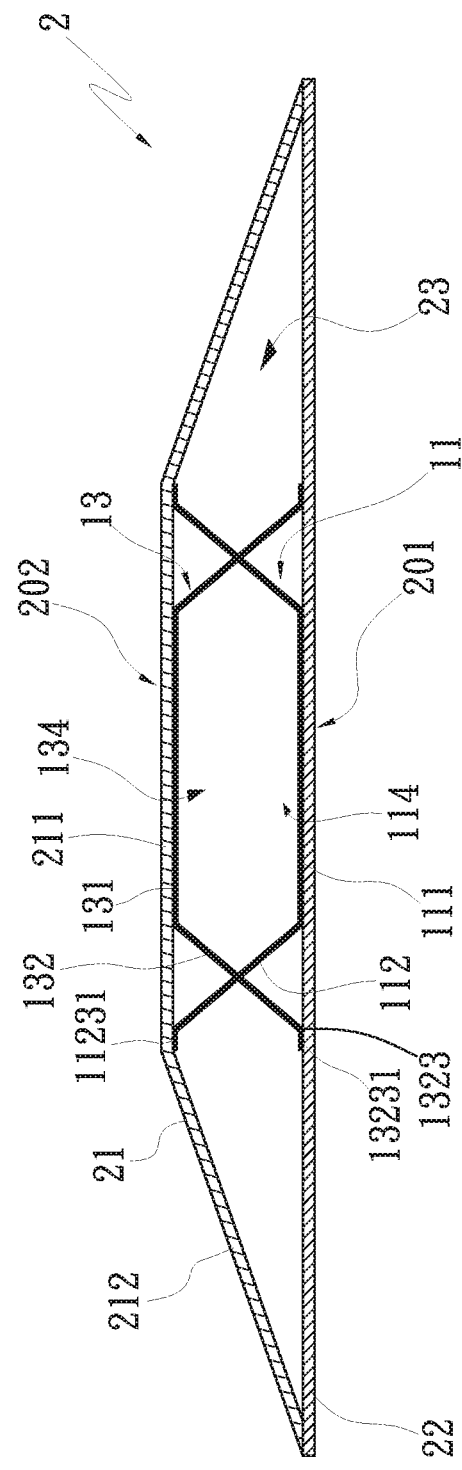
FIG. 5A is an assembled cross-sectional view of the heat-dissipating unit according to another variant of the second embodiment of the present invention.
Figure 5B:
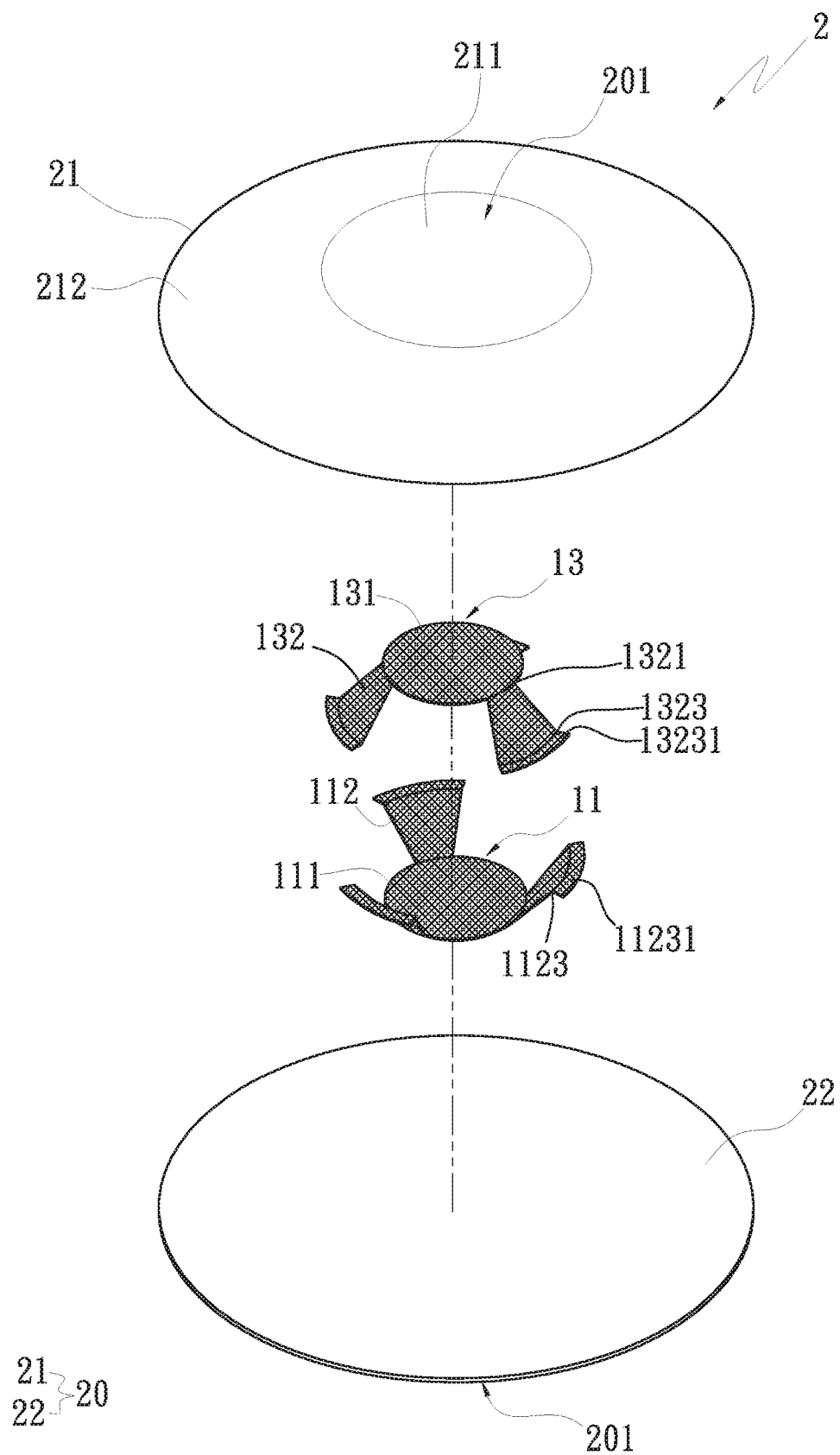
FIG. 5B is an exploded view of the heat-dissipating unit in FIG. 5A.

In another alternative embodiment, referring to FIGS. 5A and 5B, the heat-dissipating unit 2 further comprises another flexible wick structure 13. The flexible wick structure 13 and the flexible wick structure 11 are disposed in an alternate, an intersecting, a corresponding, or a spaced pattern. The structure, external appearance, and functions of the flexible wick structure 13 which comprises another wick body 131 and a plurality of extension portions 132, each having a fixed end 1321, a free end 1323, and a foot portion 13231 are the same as those of the previously-mentioned flexible wick structure 11 and will not be described again hereafter. In the current embodiment, the wick body 131 is in contact with the inner side of the condenser 202 (i.e., the inner side of the upper plate 22) and the extension portions 132 are in contact with the inner side of the evaporator 201 (i.e., the inner side of the lower plate 22). Also, the flexible wick structure 13 and the flexible wick structure 11 together define and use the axial-displacement space 114. Therefore, by means of two flexible wick structures 11, 13 used as the wick structures in the evaporator 201 and the condenser 202 of the heat-dissipating body 20, the condensed working liquid can rapidly flow back to effectively enhance the heat-dissipating cycle.

Figure 6A:
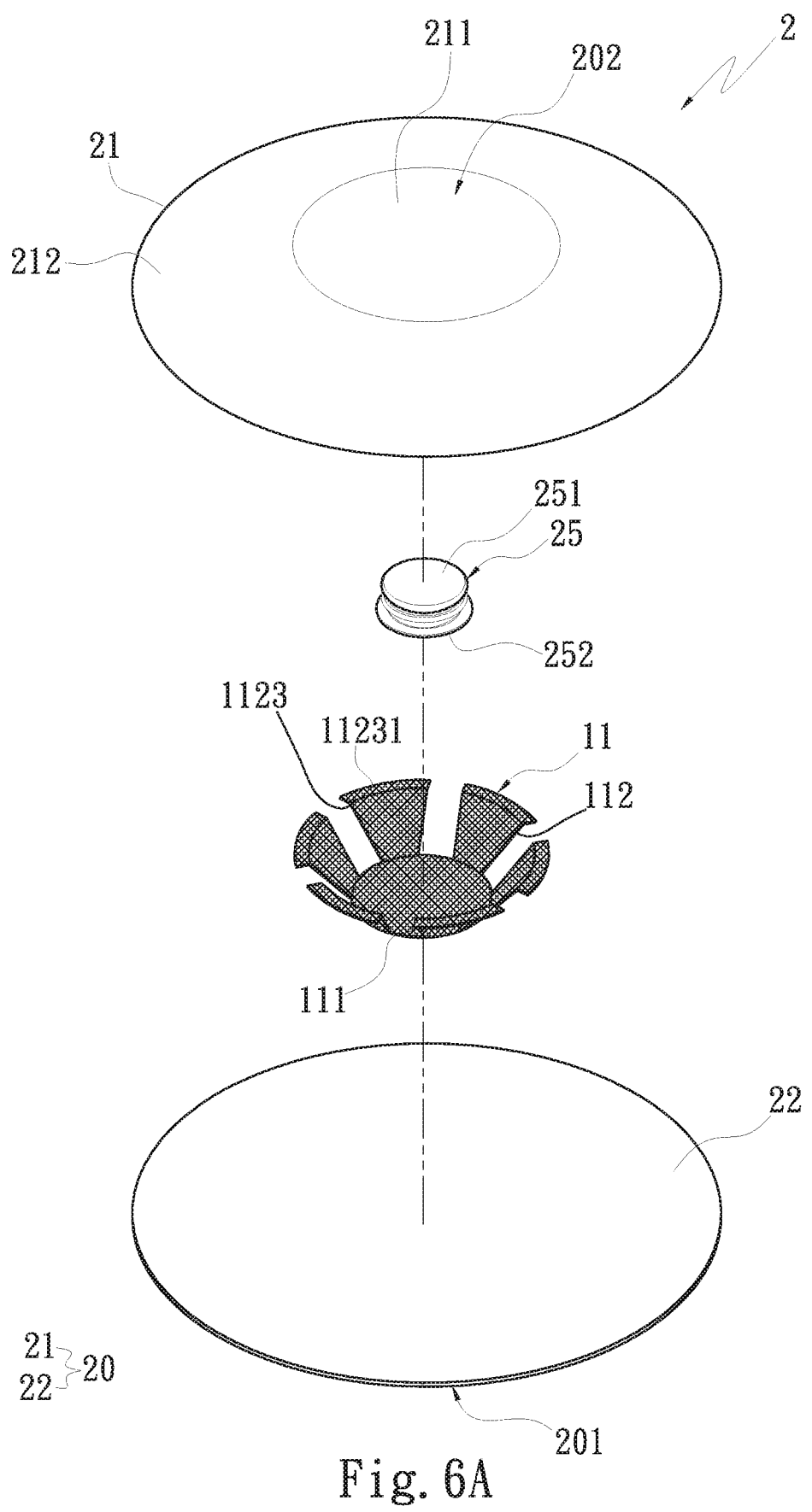
FIG. 6A is an exploded view of the heat-dissipating unit according to a variant of the second embodiment of the present invention.

In another alternative embodiment, referring to FIGS. 6A, 6B, and 6C, the deformable heat-dissipating unit 2 further comprises a flexible support 25 disposed in the axial-displacement space 114 to support the flexible wick structure 11 and the base 211. The flexible support 25 has a top 251 and a bottom 252; the top 251 is stuck to the inner side of the base 211 and the bottom 252 is pressed against the bottom side of the wick body 111. Through the flexible support 25, the structural flexibility and buffering effect of the heat-dissipating body 20 can be improved. Further, the elastic recovery force of the flexible support 25 can facilitate the flexible wick structure 11 and the base 211 of the upper plate 21 to move upwards and rapidly return to the original state (i.e., the state in which the upper plate 21 of the heat-dissipating body 20 and the flexible wick structure 11 are not compressed and deformed as shown in FIG. 6B).

Therefore, by means of the design of the heat-dissipating unit 2 of the present invention provided with the flexible wick structure 11, both effects of the deformation under compression and the capillary attraction can be obtained. Besides, the whole heat-dissipating body 20 has improved structural flexibility. During the assembly, the heat-dissipating unit 2 is applicable to meet various requirements if its height falls between the first height H1 and the second height H2. In addition, the heat-dissipating unit 2 can be applied to an electronic apparatus (e.g., a smartphone or a computer), a server, communication equipment, or industrial equipment. When the base 211 of the upper plate 21 of the heat-dissipating unit 2 is assembled to a heat-dissipating apparatus with plural fins, a buckle (not shown) is used to fasten the heat-dissipating apparatus (not shown) to exert a downward compact force to the heat-dissipating apparatus. At this moment, the heat-dissipating unit 2 will undergo the downward compact force through the base 211 to be compressed and move downwards in the chamber 23; the side portion 212 also experiences the downward compact force from the base 211 to be elastically deformed downwards in the chamber 23. After the buckle is fastened to the heat-dissipating apparatus, the bottom side of the heat-dissipating apparatus is in tight contact with the outer side of the base 211 of the upper plate 21 of the heat-dissipating unit 2 such that the deformable heat-dissipating unit 2 of the present invention has the effects of pressure bearing and pressure resistance.

Figure 2:
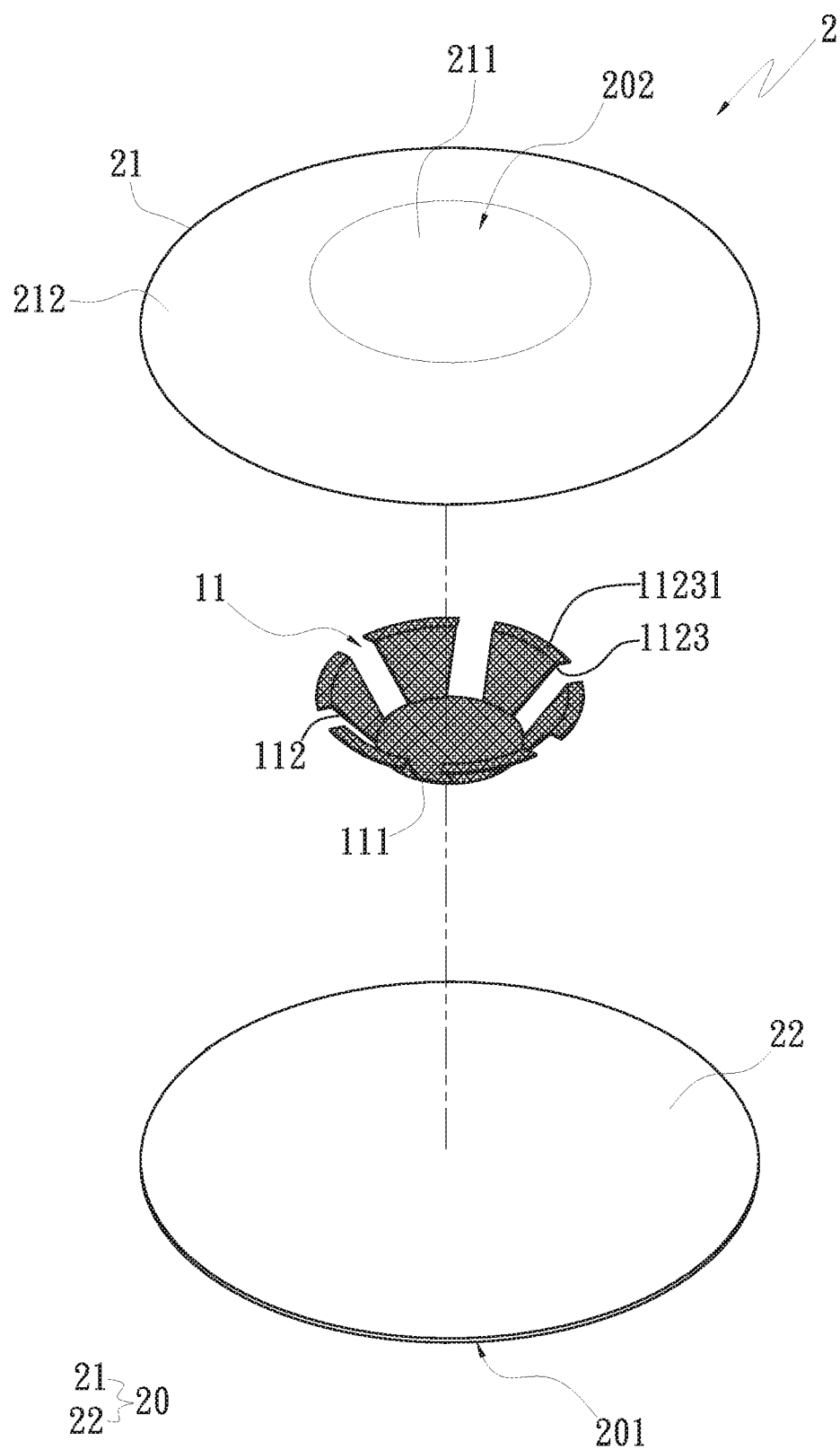
FIG. 2 is an exploded view of the heat-dissipating unit according to the second embodiment of the present invention.
Figure 3:
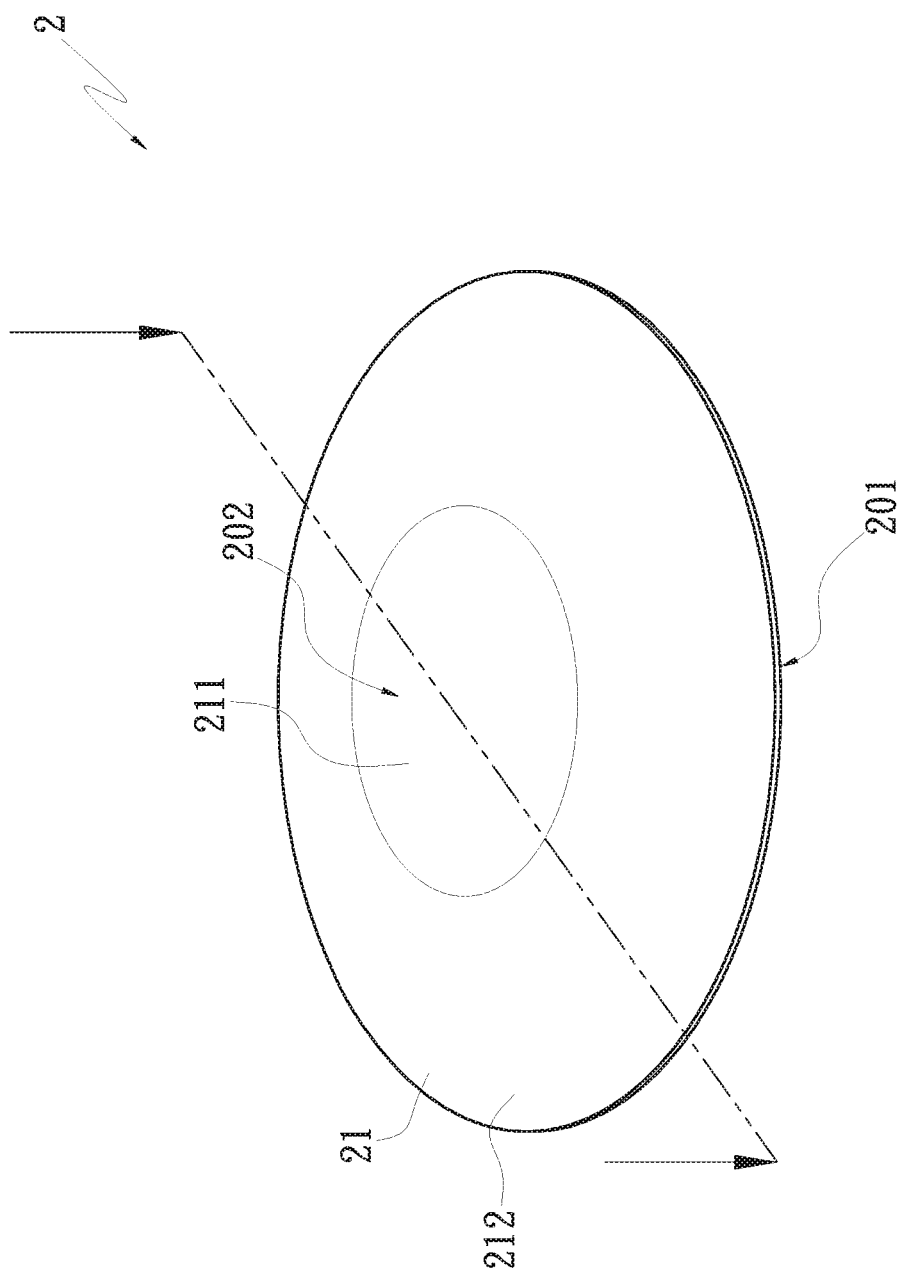
FIG. 3 is an assembled view of the deformable heat-dissipating unit according to the second embodiment of the present invention.
Figure 7:
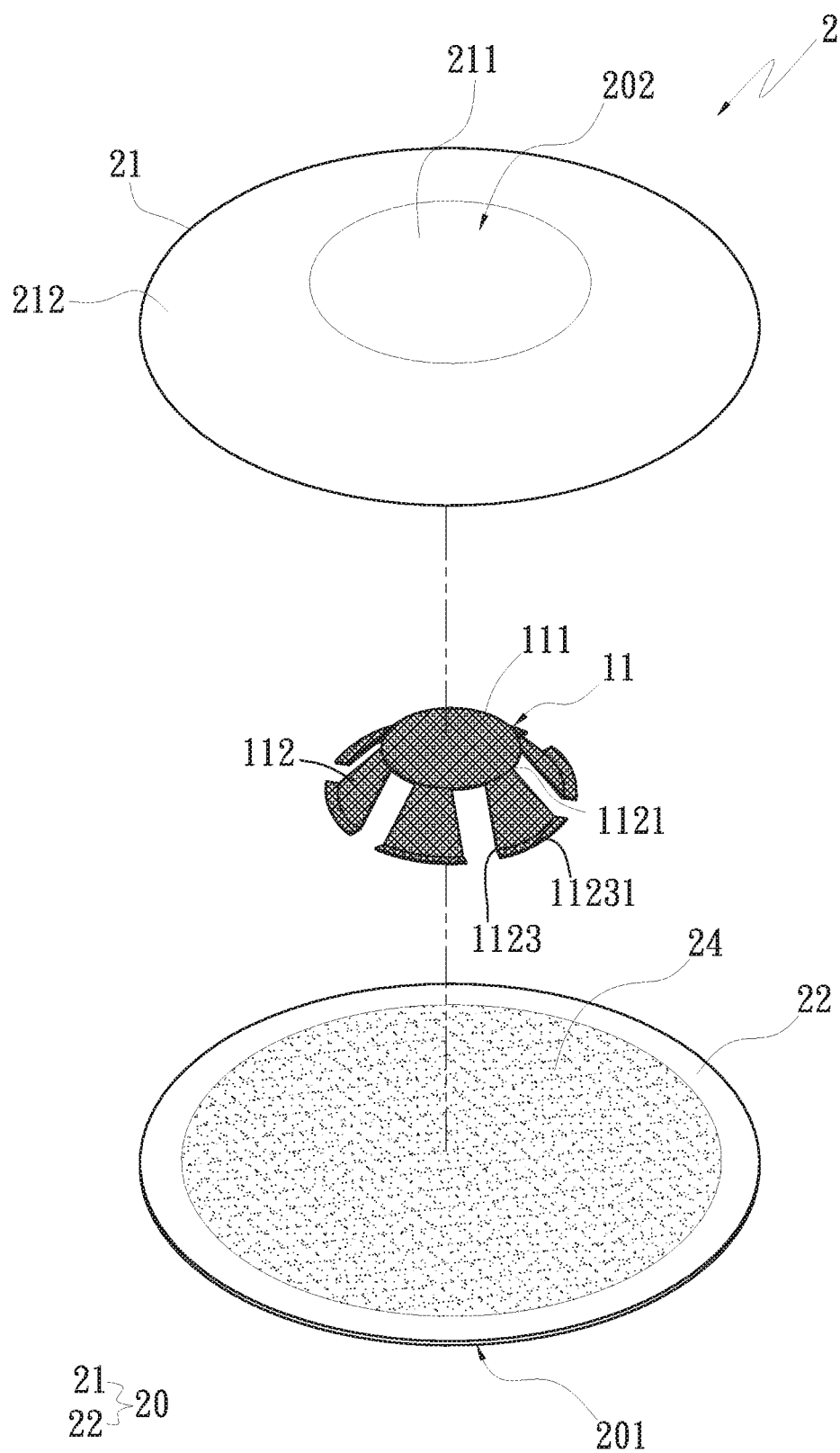
FIG. 7 is an exploded view of the heat-dissipating unit according to the third embodiment of the present invention.
Figure 8:
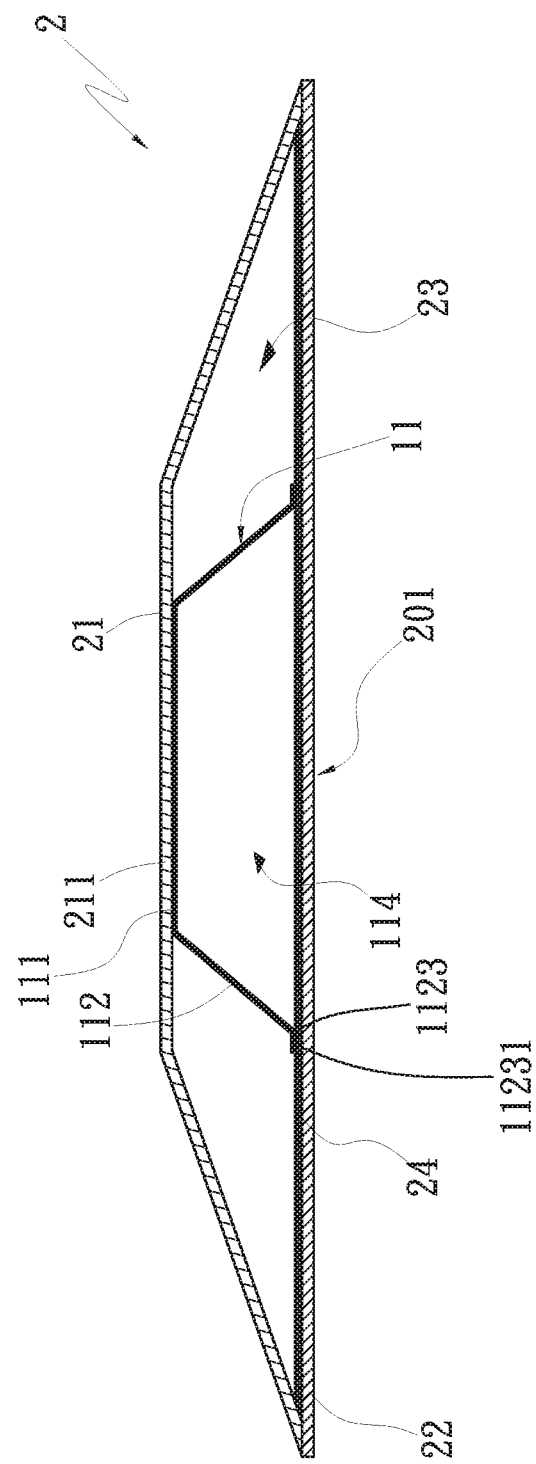
FIG. 8 is a cross-sectional view of the heat-dissipating unit according to the third embodiment of the present invention.

Please refer to FIG. 7 which is an exploded view of the heat-dissipating unit according to the third embodiment of the present invention and FIG. 8 which is a cross-sectional view of the heat-dissipating unit according to the third embodiment of the present invention, together with FIGS. 1 and 2. In the current embodiment, the structure, the connection relationship, the original state (or the compressed and deformed state) and functions of the heat-dissipating unit 2 which comprises the heat-dissipating body 20 and the flexible wick structure 11 are roughly similar to those of the heat-dissipating unit 2 in the second embodiment and will not be described again hereafter. In the current embodiment, the orientation of the flexible wick structure 11 of the second embodiment shown in FIG. 2 is changed as the orientation shown in FIG. 7 in which the wick body 111 of the flexible wick structure 11 is in contact with the inner side of the condenser 202 (i.e., the inner side of the upper plate 22) and the extension portions 112 are in contact of the wick structure 24 on the inner side of the evaporator 201 (i.e., the inner side of the lower plate 22). Therefore, by means of the capillary attractions of the wick body 111, the extension portions 112, and the horizontally-extending foot portions 11231 thereon, the condensed working liquid can rapidly flow back down to the wick structure 24 on the inner side of the evaporator 201 with a continuous heat-dissipating cycle of vapor and liquid.

Therefore, by means of the design of the deformable heat-dissipating unit 2 provided with the flexible wick structure 11, both effects of the deformation under compression and the capillary attraction can be obtained. Besides, the structural flexibility of the whole heat-dissipating body 20 can be effectively improved.

What is claimed is:

1. A deformable heat-dissipating unit comprising:
    a heat-dissipating body having an upper plate with a condenser portion, a chamber, a lower plate covered with the upper plate and with an evaporator portion, and a working fluid filled in the chamber and
    a flexible wick structure disposed in the chamber and having a wick body and a plurality of extension portions integrally formed with the wick body and obliquely extending outwards from a perimeter of the wick body to carry the wick body, wherein the extension portions and the wick body together define an axial-displacement space, wherein each of the extension portions has an end that is distal from the wick body and extending outwards and horizontally to form a foot portion, wherein the foot portions are in contact with an inner side of the condenser portion of the upper plate, and wherein the wick body is correspondingly in contact with an inner side of the evaporator portion of the lower plate and wherein, under compression of an axially directed external force, the foot portions slide outwardly and under removal of the axially directed external force, the foot portions elastically slide inwardly.

2. The deformable heat-dissipating unit according to claim 1, wherein the upper plate is provided with a base and a side portion which can be elastically deformed under compression, wherein the side portion extends outwards from the edge of the base.

3. The deformable heat-dissipating unit according to claim 2, further comprising a flexible support disposed in the axial-displacement space, wherein the flexible support has a top and a bottom, wherein the top is stuck to an inner side of the base and the bottom is pressed against a bottom side of the wick body.

4. The deformable heat-dissipating unit according to claim 1, further comprising another flexible wick structure, wherein the another flexible wick structure and the flexible wick structure are disposed in an alternate, an intersecting, a corresponding, or a spaced pattern, wherein the another flexible wick structure and the flexible wick structure together define and use the axial-displacement space.

5. The deformable heat-dissipating unit according to claim 1, wherein the flexible wick structure is a porous liquid-absorbing structure which is woven from filaments made of a plurality of kinds of metal, non-metal, or plastic materials, wherein the metal filaments are made of copper, stainless steel, aluminum, nickel, titanium, alloy, or a combination thereof.

6. The deformable heat-dissipating unit according to claim 1, wherein the chamber of the heat-dissipating body is a vapor chamber.

7. The deformable heat-dissipating unit according to claim 1, wherein a wick structure is disposed in the chamber, wherein the wick structure is disposed on the inner side of the upper plate or the lower plate of the chamber or disposed on the inner side of the whole chamber.

* * * * *